United States Patent [19]
Gardner et al.

[11] Patent Number: 5,888,872
[45] Date of Patent: Mar. 30, 1999

[54] METHOD FOR FORMING SOURCE DRAIN JUNCTION AREAS SELF-ALIGNED BETWEEN A SIDEWALL SPACER AND AN ETCHED LATERAL SIDEWALL

[75] Inventors: Mark I. Gardner, Cedar Creek; Daniel Kadosh, Austin, both of Tex.

[73] Assignee: Advanced Micro Devices, Inc.

[21] Appl. No.: 879,574

[22] Filed: Jun. 20, 1997

[51] Int. Cl.[6] .................................................. H01L 21/336

[52] U.S. Cl. ...................... 438/300; 438/155; 438/305; 438/588

[58] Field of Search ..................................... 438/155, 406, 438/300, 297, 588, 305, 306; 257/347

[56] References Cited

U.S. PATENT DOCUMENTS

| | | | |
|---|---|---|---|
| 4,381,201 | 4/1983 | Sakurai | 438/155 |
| 4,489,478 | 12/1984 | Sakurai | 438/155 |
| 4,902,637 | 2/1990 | Kondou et al. | 257/347 |
| 5,266,511 | 11/1993 | Takao | 438/406 |
| 5,418,177 | 5/1995 | Choi | 438/155 |
| 5,470,776 | 11/1995 | Ryou | 438/155 |
| 5,731,217 | 3/1998 | Kadosh et al. | 438/300 |

*Primary Examiner*—Charles Bowers
*Assistant Examiner*—Jack Chen
*Attorney, Agent, or Firm*—Kevin L. Daffer; Conley, Rose & Tayon

[57] ABSTRACT

An integrated circuit fabrication process is provided in which an elevated doped polysilicon structure may be formed and isolated from another polysilicon structure lying in the same elevated plane. The elevated structure may serve as a junction area of a transistor formed entirely within and upon the elevated polysilicon. The elevated structure frees up space within the lower level substrate for additional transistors and/or lateral interconnect, a benefit of which is to promote higher packing density within the integrated circuit. A first transistor is provided which is disposed upon and within a silicon-based substrate. A primary interlevel dielectric is deposited across the transistor and the substrate. Polysilicon may then be deposited across the primary interlevel dielectric and doped using ion implantation. A second transistor may be formed upon and within a portion of the polysilicon layer. The second transistor has a pair of implant regions spaced from each other by a gate conductor and a pair of oxide spacers arranged on opposed sidewall surfaces of the gate conductor. Part of the polysilicon layer is removed such that polysilicon only extends under the gate conductor and terminates a pre-defined distance from each of the pair of oxide spacers. A pair of junctions remain for the second transistor that are defined between an etched lateral edge and an oxide spacer. A second interlevel dielectric may be deposited across the second transistor and exposed areas of the primary interlevel dielectric to isolate the transistor from other active devices.

9 Claims, 4 Drawing Sheets

METHOD FOR FORMING SOURCE DRAIN JUNCTION AREAS SELF-ALIGNED BETWEEN A SIDEWALL SPACER AND AN ETCHED LATERAL SIDEWALL

BACKGROUND OF THE INVENTION

1. Field of the Invention

This invention relates to integrated circuit fabrication and, more particularly, to forming a transistor upon and within a doped polysilicon region a spaced distance above another transistor, wherein a pair of junctions of the transistor have lateral surfaces formed by etching of the polysilicon region.

2. Description of the Related Art

Active devices are well known. They are classified as any device which is not passive. A transistor is but one example of an active device. Transistors are therefore regarded as a basic building block of an integrated circuit. Transistor fabrication typically involves forming source/drain impurity regions (hereinafter "junctions") within a single crystalline silicon substrate and gate conductors spaced from the substrate by a gate dielectric arranged between the junctions. Isolation structures are used to isolate the junctions of a transistor from other active areas employed by an integrated circuit. Isolation structures may comprise shallow trenches etched in the substrate that are filled with a dielectric using chemical vapor deposition. Alternately, isolation structures may comprise local oxidation of silicon ("LOCOS") structures which are thermally grown using, e.g, wet oxidation.

Ion implantation of dopants is primarily used to form junctions. Alternatively, although less often used, the junctions may be formed by diffusion doping. Ion implantation involves placing energetic, charged atoms or molecules directly into the substrate surface. The resulting junctions may be self-aligned between the isolation structures and oxide spacers arranged on opposing sidewall surfaces of the gate conductor and gate dielectric. The number of implanted dopant atoms entering the substrate is more easily controlled using ion implantation. Ion implantation results in junctions having a majority carrier opposite that of the surrounding bulk substrate or well area.

Because of the increased desire to build faster and more complex integrated circuits, it has become necessary to form relatively small, closely spaced multiple transistors within a single integrated circuit. In most core logic areas of an integrated circuit there are logic gates and interconnection between those gates. A substantial portion of the core logic areas involves routing interconnect between gates or enlarging junctions to accommodate mutual connection to those junctions. In either instance, the conventional solution to high density core layout is the occupation of lateral area. Unfortunately, since transistors are generally formed within the silicon-based substrate of an integrated circuit, the number of transistors per integrated circuit is limited by the available lateral area of the substrate. Moreover, transistors cannot employ the same portion of a substrate, and increasing the area occupied by the substrate is an impractical solution to this problem. Thus, packing density of an integrated circuit is somewhat sacrificed by the common practice of forming transistors exclusively within a substrate having a limited amount of area.

Conventional transistor isolation techniques have several drawbacks. The previously mentioned LOCOS structures typically arise by first forming a thermally grown or blanket deposited oxide (i.e., pad oxide) layer across the substrate. A thick layer of silicon nitride is deposited across the oxide layer using chemical vapor deposition. Select portions of the silicon nitride are then removed to expose areas of the silicon-based substrate above which the LOCOS structures are to be formed. The LOCOS structures are thermally grown by oxidizing silicon within the exposed areas. The field oxide grows where no masking nitride exists as well as at the edges of the nitride. Unfortunately, some field oxide also grows under the nitride edges, causing the nitride edges to be lifted upward. Thus, the field oxide may encroach into nearby active device regions. Since active device regions may only be 1.0 micron in width, they might be substantially replaced by an encroaching field oxide.

The encroaching field oxide may also lead to another problem during the subsequent step of forming a conductive contact through an interlevel dielectric to a junction adjacent a LOCOS structure. During contact formation, a portion of the interlevel dielectric must be etched away to form an opening therethrough. Overetching may occur, causing a portion of the encroaching field oxide to be removed. This may expose the substrate region under the junction. Thus, a short may result between the junction and the oppositely doped substrate when a conductive material is deposited into the opening. Another limitation of using LOCOS isolation structures is that the thickness of the thermally grown field oxide in submicron regions of exposed silicon is significantly thinner than that grown in wider spacings. Thin field oxides that result from this effect may have an adverse effect on interconnect capacitances to substrate and on the threshold voltage between junctions spaced apart by a LOCOS structure.

The aforementioned isolation structures formed using a shallow trench etch and fill technique also have several disadvantages. For example, void formation can occur if field oxide is deposited into trenches that are narrower than about 2.0 microns. Inversion of the silicon at the sidewalls of p-type active regions may also occur. Moreover, the deposited field oxide must be etched back so that it remains only within the trench and its top surface is level with the original substrate surface. Planarization of the field oxide may be achieved by applying layers of photoresist across the field oxide and substrate surfaces and then etching the field oxide and resist at the same rate. The planarization etch results in shallow isolation structure profiles which vary among different areas. Furthermore, the resist layer tends to not be perfectly planarized and the field oxide must be overetched to ensure that it is removed from all active areas. Thus, the field oxide is etched below the surface of an active area, exposing a portion of a active area sidewall, thereby leading to undesired edge-parasitic conduction and to a higher electric field in the gate dielectric at the sidewall. The resulting threshold voltage of the corner region where the sidewall meets the gate dielectric is undesirably lower than the interior portion of the active device.

It is therefore desirable that a semiconductor fabrication process be developed for the formation of more densely packed transistors. Such a process would lead to an increase in circuit speed as well as an increase in circuit complexity. Furthermore, it is desirable that a better technique be developed for active region isolation, e.g., isolation of transistors. An isolation technique is needed which would ensure that substantially no current flows between isolated active devices. Moreover, a technique is desired that does not require overetching of the isolation oxide to remove it completely from active regions. Further, it is desirable that the isolation oxide not encroach on active device regions and under junctions, thereby preventing shorting between junction and substrate.

SUMMARY OF THE INVENTION

The problems outlined above are in large part solved by the fabrication process of the present invention. That is, a method for forming a doped polysilicon layer elevated above an integrated circuit substrate is provided. The elevated, doped polysilicon layer provides another elevation plane on which and into which active devices can be drawn. This ensures a multi-level transistor fabrication method that provides for high packing density of transistors and of active regions around the transistors. Of prime importance, however, is the technique used to isolate active devices lying in the elevation plane. The isolation technique of the present invention involves forming implant regions in the upper portion of the polysilicon layer that are self-aligned to oxide spacers. The oxide spacers are located on opposite sidewall surfaces of gate conductors arranged at spaced distances apart across the polysilicon layer. Thus, each implant region is formed between gate conductors and may be shared by two laterally adjacent transistors. In order to isolate the transistors, portions of the polysilicon layer that contain the implant regions are removed such that retained portions of the polysilicon layer form one or more active devices isolated from one or more devices.

An isolation oxide may then be blanket deposited across and between the active devices embodied upon and within the elevation plane. This isolation oxide also serves as an interlevel dielectric. Since forming the isolation oxide does not require an oxidizing ambient, oxide does not encroach under active regions within the doped polysilicon structures. Further, since the isolation oxide is blanket deposited and then selectively etched, good planarization of the isolation oxide may be accomplished using chemical-mechanical polishing. Moreover, since implant regions are formed prior to the isolation oxide formation, etching is not required to remove the oxide from above the implant regions. Therefore, overetching of the oxide in certain areas can be avoided to prevent, inter alia, junction parasitic edge-conduction. In fact, the problems associated with LOCOS isolation structures and shallow trench isolation structures are substantially absent when using the present isolation method.

According to one embodiment, a first transistor is provided which is disposed upon and within a single crystalline silicon substrate. The first transistor includes a first gate conductor spaced between a first pair of junctions. A primary interlevel dielectric is deposited across the transistor and the substrate. Polycrystalline silicon, i.e., polysilicon may then be chemical vapor deposited ("CVD") across the primary interlevel dielectric and blanket doped using ion implantation. A gate dielectric and gate conductor may be formed sequentially upon a portion of the doped polysilicon layer. A lightly doped drain ("LDD") implant is self-aligned to the lateral edges of the gate conductor. The LDD implant forms LDD areas within the upper surface of the polysilicon layer. Oxide spacers may then be formed on opposite sidewall surfaces of the gate conductor. Ion implantation is continued to form heavily doped source/drain regions within the upper surface of the polysilicon layer. The dopants used during LDD and source/drain ("S/D") implant are preferably of opposite type to those used to dope the polysilicon layer. The S/D implant is self-aligned to the edges of the oxide spacers so that the S/D regions overlap most of the LDD areas. A second transistor elevated in a plane above the first transistor is thus created.

Select portions of the polysilicon layer are then removed by anisotropic etch. Removal of these portions exposes areas of the underlying primary interlevel dielectric. The retained portion of the polysilicon layer may extend horizontally under the gate dielectric and terminate a pre-determined distance from each of the oxide spacers of the second transistor. Thus, a lateral edge for each junction of the second transistor is formed by an etch removal step. Interconnects may be formed laterally adjacent to the lateral edges of the junctions if necessary. A secondary interlevel dielectric may then be deposited across the second transistor and exposed areas of the primary interlevel dielectric to isolate the second transistor from other active device regions. For example, if a third transistor is formed a spaced lateral distance form the second transistor, the third transistor becomes isolated from the second transistor by the removal of portions of implant regions shared by the two transistors. The secondary interlevel dielectric further serves as an isolation dielectric for the two transistors since it may be interposed between junctions attributed to each laterally spaced transistor.

BRIEF DESCRIPTION OF THE DRAWINGS

Other objects and advantages of the invention will become apparent upon reading the following detailed description and upon reference to the accompanying drawings in which.

Figure 1:
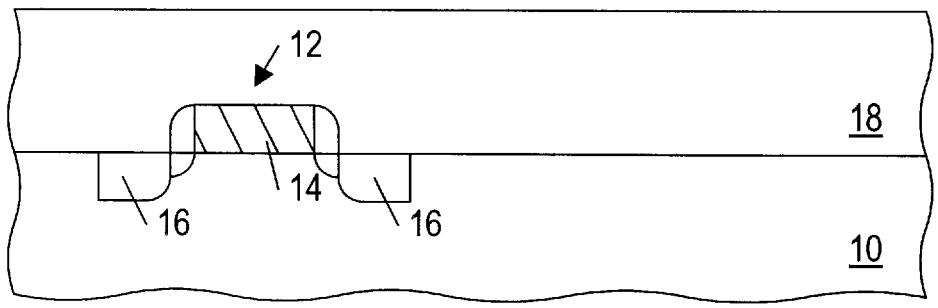
FIG. 1 is a cross-sectional view of a semiconductor topography embodying a first transistor, wherein a primary interlevel dielectric is deposited across the semiconductor topography.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning to FIG. 1, a single crystalline silicon substrate 10 is depicted. A transistor 12 is provided upon and within substrate 10. Transistor 12 includes a pair of junctions 16 spaced by a polysilicon gate conductor 14. A primary interlevel 18 is shown as being blanket deposited across the topography comprising, e.g., transistor 12 and substrate 10. Chemical-mechanical polishing may be used to make the upper surface of interlevel dielectric 18 somewhat planar. Interlevel dielectric 18 is composed of silicon dioxide but may comprise other insulating materials as well. Various methods may be used to form interlevel dielectric 18, including deposition of an oxide- or glass-based material.

Figure 2:
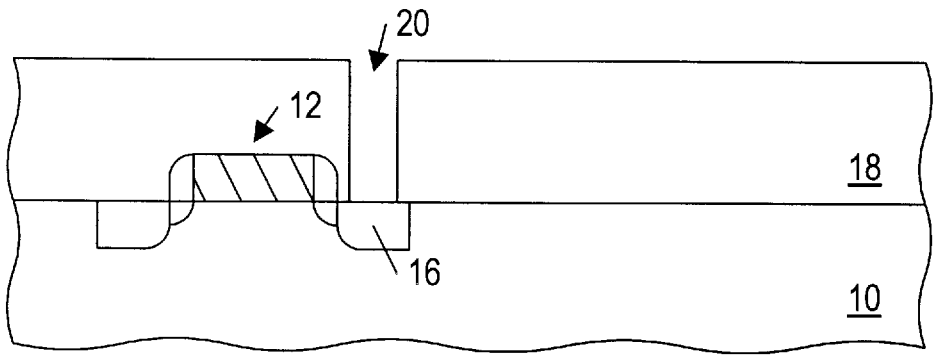
FIG. 2 is a cross-sectional view of the semiconductor topography, wherein an opening may be formed that extends through the primary interlevel dielectric to a junction of the first transistor, subsequent to the step in FIG. 1.
Figure 3:
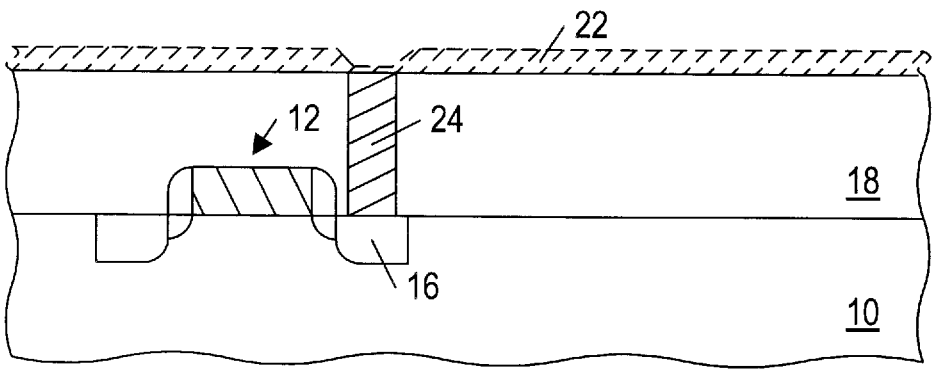
FIG. 3 is a cross-sectional view of the semiconductor topography, wherein a conductive material is arranged exclusively within the opening to form a plug, subsequent to the step in FIG. 2.

As shown in FIG. 2, an opening 20 may be formed, according to one embodiment, vertically through primary interlevel dielectric 18 by removing a portion of the dielectric using either a wet chemical or a dry, plasma etch. Plasma etch is preferred so that the lateral surfaces of opening 20 are relatively vertical. Plasma etch can take place in a parallel plate reactor using ion-assisted reactants. During plasma etch, the etch duration may be timed to terminate a defined distance into interlevel dielectric 18 before etch of the topography below the interlevel dielectric begins. Opening 20 may be formed such that it extends down to one of the junctions 16. Turning to FIG. 3, a conductive material, such as tungsten or titanium nitride followed by tungsten, is deposited across primary interlevel dielectric 18 and into opening 20. A portion 22 of the conductive material is removed from the surface of primary interlevel dielectric 18 to form a conductive plug 24 arranged exclusively in opening 20. Portion 22 may be cleared away using chemical-mechanical polishing. Alternatively, portion 22 may be removed by a sacrificial etch back or by a lithography step, followed by a selective etch that does not attack interlevel dielectric 18.

Figure 4:
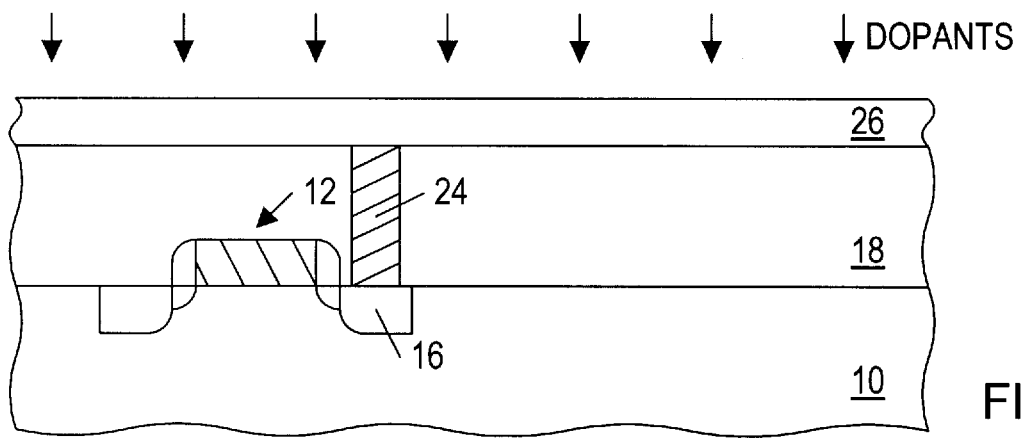
FIG. 4 is a cross-sectional view of the semiconductor topography, wherein a doped polysilicon layer is formed across the primary interlevel dielectric and the plug, subsequent to the step in FIG. 3.
Figure 5:
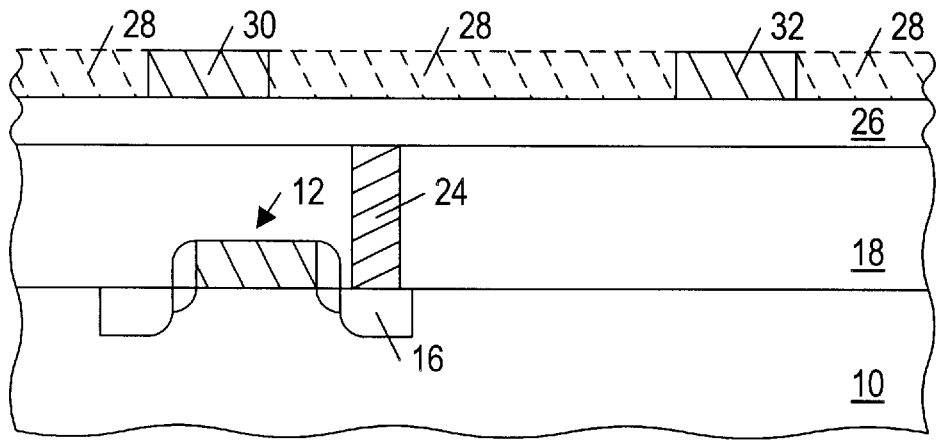
FIG. 5 is a cross-sectional view of the semiconductor topography, wherein first and second gate conductors are formed upon the primary interlevel dielectric, subsequent to the step in FIG. 4.

FIG. 4 illustrates a polysilicon layer 26 being deposited across primary interlevel dielectric 18 and plug 24. Polysilicon layer 26 is preferably doped with either p-type dopants or n-type dopants. Some commonly used p-type dopants are boron or boron difluoride, and some commonly used n-type dopants are arsenic or phosphorus. Doped polysilicon layer 26 serves as a second substrate that lies in an elevated plane above the first substrate 10. FIG. 5 depicts the formation of gate conductors 30. Gate conductors 30 and 32 may be formed from CVD polysilicon. Portions 28 of the polysilcon deposited across polysilicon layer 26 may be etched away to the underlying polysilicon, leaving gate conductors 30 and 32 behind.

Figure 6:
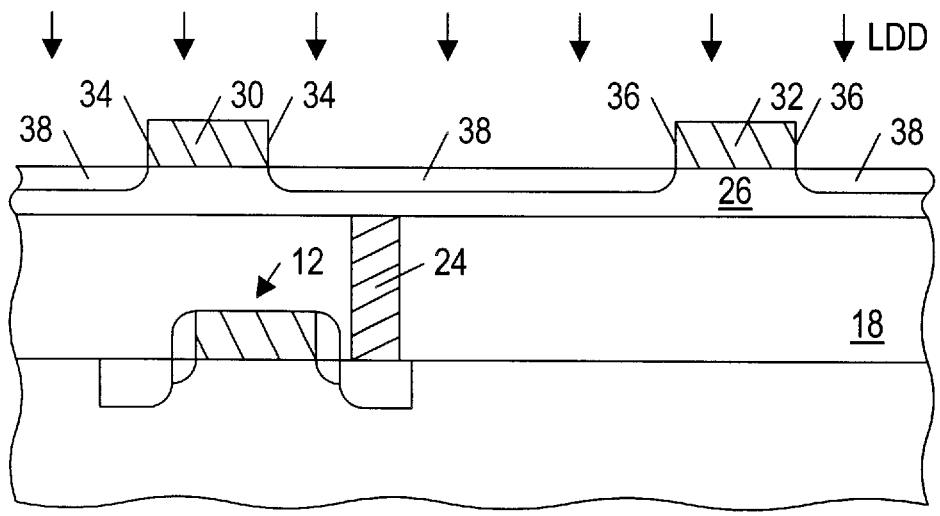
FIG. 6 is a cross-sectional view of the semiconductor topography, wherein an LDD implant is forwarded into the polysilicon layer to form LDD areas self-aligned to the lateral edges of the gate conductors, subsequent to the step in FIG. 5.
Figure 7:
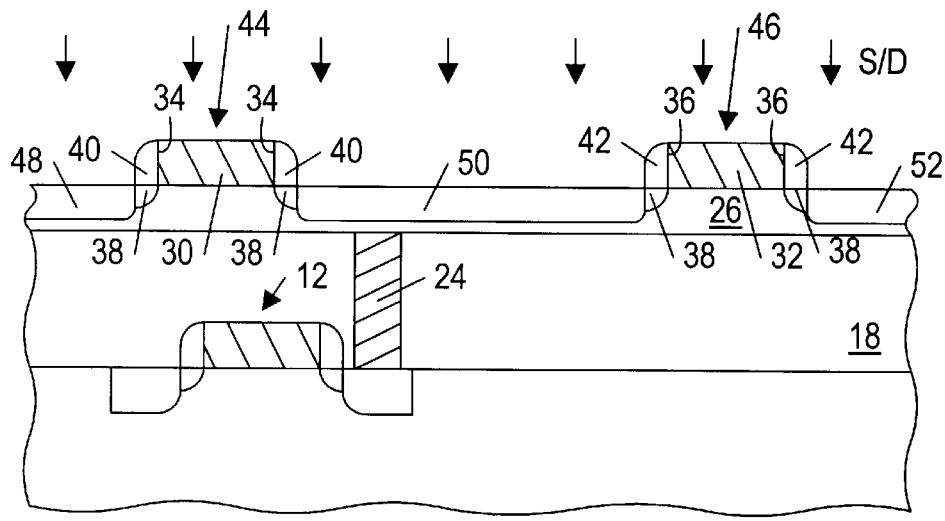
FIG. 7 is a cross-sectional view of the semiconductor topography, wherein oxide spacers are formed on the lateral edges of the gate conductors, followed by source/drain regions self-aligned to the edges of the spacers, subsequent to the step in FIG. 6.

Turning to FIG. 6, a LDD implant is forwarded to polysilicon layer 26 and gate conductors 30 and 32. This implant preferably forms LDD areas 38 within areas of the upper surface of polysilicon layer 26 not covered by the gate conductors. The LDD implant is self-aligned to opposed sidewall surfaces 34 and 36 of gate conductors 30 and 32, respectively. LDD areas 38 forms lightly doped sections on opposite sides of channels existing directly below gate conductors 30 and 32. FIG. 7 depicts the formation of oxide spacers 40 upon sidewall surfaces 34 and oxide spacers 42 upon sidewall surfaces 36. These oxide spacers are formed by the deposition of oxide across polysilicon layer 26 and gate conductors 30 and 32, followed by anisotropic removal of the oxide exclusive of oxide spacers 40 and 42. Anisotropic removal implies removing oxide except on horizontal surfaces to which the anisotropically directed etchant ions cannot readily access. Then a heavily doping S/D implant may be forwarded to polysilicon layer 26 and gate conductors 30 and 32. The S/D implant is self-aligned to lateral surfaces of oxide spacers 40 and 42. Thus, S/D implant regions 48, 50, and 52 overlap portions of LDD areas 38. These implant regions are doped so that they contain a majority charge carrier opposite that of the surrounding bulk polysilicon layer 26. The dopants are preferably forwarded by ion implantation at an energy such that the peak concentration is approximately less than the midline between the upper and lower surfaces of the polysilicon structure. The concentration is chosen to effectuate whatever threshold voltage is needed to operate, within the design specification, the ensuing transistor. The S/D implant completes the formation of transistors 44 and 46 which are laterally adjacent to each other. S/D implant region 50 is initially shared by the two transistors. Transistors 44 and 46 are located in an elevated plane with respect to the location of transistor 12. Thus, the integrated circuit employing transistors 44 and 46 can have a higher packing density than circuits in which transistors are only formed across a single, limited lateral plane.

Figure 8:
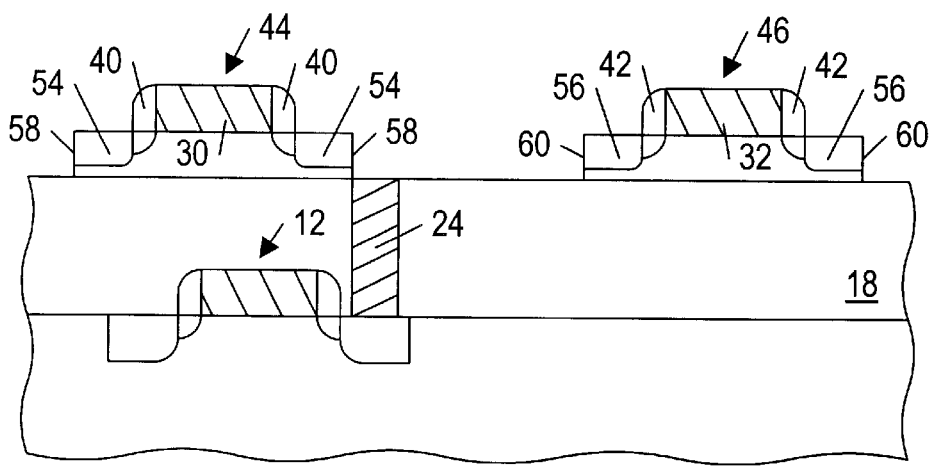
FIG. 8 is a cross-sectional view of the semiconductor topography, wherein select portions of the polysilicon layer that embody S/D regions are removed to form lateral edges that define S/D junctions for each transistor, subsequent to the step in FIG. 7.

As shown in FIG. 8, implant regions 48, 50, and 52 may be converted into separate pairs of S/D junctions for isolating transistors 44 and 46. Portions of polysilicon layer 26 may be removed by using a dry plasma, etch. Etch duration may be chosen such that etching terminates a pre-determined distance below the surface of the polysilicon layer 26 and stops before any dielectric material is removed. A patterned photoresist layer may be used to cover regions of the polysilicon that must be retained. These retained regions, i.e., polysilicon structures, extend under gate conductors 30 and 32 and terminate a pre-determined lateral distance from oxide spacers 40 and 42, respectively. The pre-determined lateral distance is known to allow a graded LDD and S/D junction. Thus, opposed lateral surfaces 58 for transistor 44 and opposed lateral surfaces 60 for transistor 46 are formed. Junctions 54 of transistor 44 are bound between the lateral exposed surfaces of oxide spacers 40 and lateral surfaces 58. Junctions 56 of transistor 46 are bound between the lateral exposed surfaces of oxide spacers 42 and lateral surfaces 58. The rightmost lateral surface 58 is preferably aligned between the leftmost lateral surface of plug 24 and a vertical plane lying midway between the lateral surfaces of plug 24.

Figure 9:
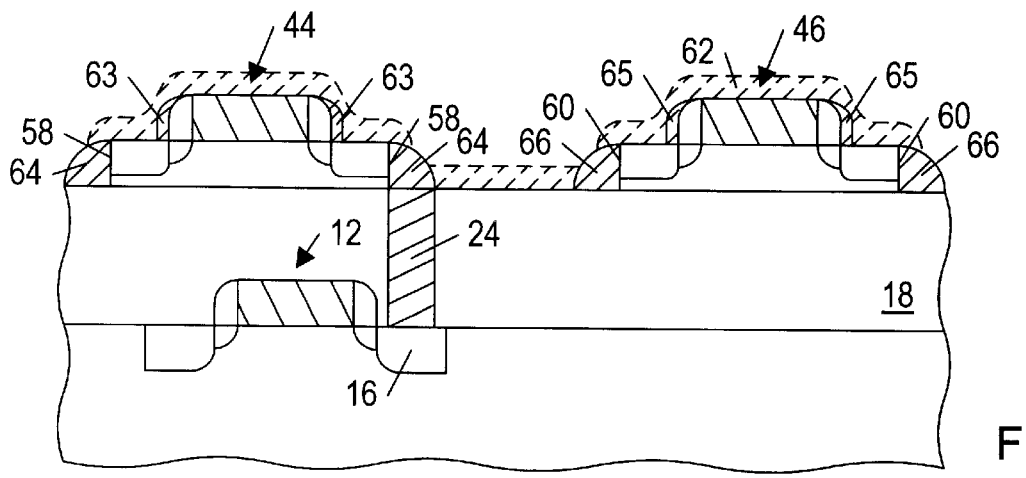
FIG. 9 is a cross-sectional view of the semiconductor topography, wherein interconnects are formed directly adjacent to the lateral edges of the S/D junctions such that at least one interconnect abuts the plug, subsequent to the step in FIG. 8.

Turning to FIG. 9, an interconnect material, such as aluminum, is deposited across the exposed surfaces of primary interlevel dielectric 18 and transistors 44 and 46. Portion 62 of the interconnect material may be removed by performing an anisotropic etch. The removed areas lie over substantially horizontal surfaces. Thus, material is removed using an ion-assisted etch involving ions bombarded upon the material perpendicular to the horizontal surfaces being cleared. Interconnects 63 are retained directly adjacent to vertical surfaces, i.e., surfaces 40, 42, 58, and 60. One retained area, i.e., interconnect 64 contacts plug 24, electrically coupling the interconnect to junction 16 of transistor 12. Further, interconnects 66 are retained directly laterally adjacent to lateral surfaces 60. Conductive structures 63 and 65 also remain on the oxide spacers due to the mechanism of anisotropic etch predominately in a vertical direction inward of a horizontal direction. Lateral surfaces 58 and 60 are very near to being perpendicular to the surface of primary interlevel dielectric 18, more so than sidewall surfaces of an interconnect patterned from a metal layer. Thus, the sidewall surfaces of the interconnects deposited against lateral surfaces 58 and 60 are relatively perpendicular to the surface of primary interlevel dielectric 18. However, since the other sidewall surfaces of the interconnects are formed by anisotropic etch, they are arcuate in shape. Interconnects 64 and 66 are relatively narrow and can be formed having a width (i.e., space between opposing lateral sidewall surfaces) of less than, for example, 1.0 micron. Interconnects 64 and 66 are formed by a controlled deposition followed by a blanket etch. Thus, misalignment of an etchant mask cannot occur as in the conventional interconnect technique.

Figure 10:
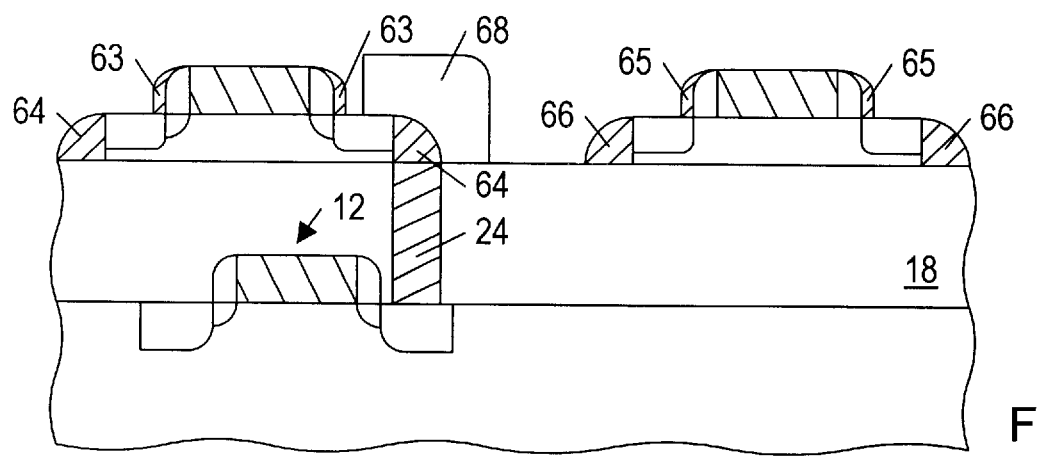
FIG. 10 is a cross-sectional view of the semiconductor topography, wherein a photoresist masking layer is formed over the interconnect that abuts the plug, followed by removing unwanted, unmasked interconnects, subsequent to the step in FIG. 9.
Figure 11:
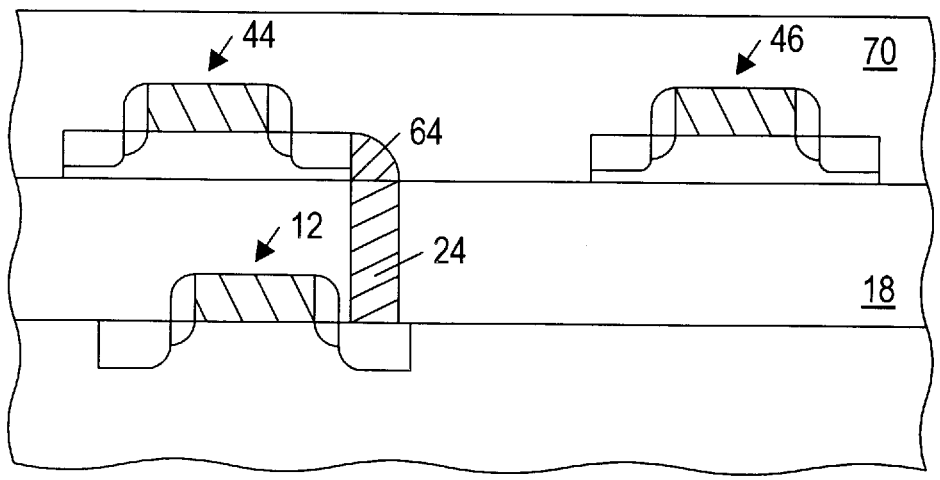
FIG. 11 is a cross-sectional view of the semiconductor topography, wherein a secondary interlevel dielectric is deposited across the first and second transistors, the remaining interconnect, and the primary interlevel dielectric, subsequent to the step in FIG. 10.

Conductive structures 63 and 65 need to be removed before the formation of other layers of the integrated circuit to ensure no contact (i.e., bridging) occurs between the gate conductors and junctions of transistors 44 and 46. FIG. 10 depicts the formation of a patterned photoresist masking layer 68 that completely covers the interconnect 64 abutting plug 24. In an embodiment, the other interconnect 64, interconnects 66, and conductive structures 63 and 65 may be removed using a wet etch that exclusively attacks the conductive material of these structures. Since photoresist layer 68 protects the rightmost interconnect 64 from the etchant being used, this interconnect remains. As shown in FIG. 11, to passivate and isolate transistors 44 and 46, a second interlevel dielectric 70 is deposited across primary interlevel dielectric 18, transistors 44 and 46, and interconnect 64. Thus, no current may flow between these two active devices. Openings extending to active regions of transistors 44 and 46 may be formed vertically through second interlevel dielectric 70. These openings may be filled with conductive material to form plugs. Thus, it is possible to form a second elevated plane containing transistors raised above transistors 44 and 46 and having contact structures therebelow.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A method for forming an integrated circuit, comprising:
   providing a first transistor comprising a first gate conductor spaced between a first pair of junctions, and further providing a primary interlevel dielectric upon the first transistor;
   forming a doped polysilicon layer across said primary interlevel dielectric;
   forming a second transistor upon and within a portion of said doped polysilicon layer, said second transistor having a second pair of implant regions spaced from each other by a second gate conductor;
   selectively removing said doped polysilicon layer from said primary interlevel dielectric while retaining a portion of said doped polysilicon layer, said portion extending under said second gate conductor and terminating a distance from said second gate conductor to form a second pair of junctions; and
   depositing a secondary interlevel dielectric across said primary interlevel dielectric and said second transistor.

2. The method as recited in claim 1, further comprising chemical-mechanical polishing of said secondary interlevel dielectric.

3. The method as recited in claim 1, wherein removing said doped polysilicon layer comprises patterning a masking material upon said doped polysilicon layer and removing the doped polysilicon between the patterned masking material.

4. The method as recited in claim 1, further comprising forming a conductive plug vertically through said primary interlevel dielectric prior to forming said doped polysilicon layer, said plug abutting at least a portion of one of said first pair of junctions.

5. The method as recited in claim 4, further comprising forming an interconnect laterally adjacent to one of said second pair of junctions arranged in proximity to said plug such that said interconnect abuts at least a portion of the plug.

6. The method as recited in claim 1, further comprising forming an interconnect laterally adjacent to each of said second pair of junctions.

7. The method as recited in claim 1, further comprising forming a third transistor upon and within a portion of said doped polysilicon layer concurrent with forming said second transistor, said third transistor being a spaced lateral distance from said second transistor and comprising a third pair of implant regions spaced from each other by a third gate conductor.

8. The method as recited in claim 7, wherein one of said third pair of implant regions is contiguous with one of said second pair of implant regions, prior to selectively removing said doped polysilicon layer.

9. The method as recited in claim 7, further comprising retaining another portion of said doped polysilicon layer concurrent with removing said polysilicon layer, said another portion extending under said third gate conductor and terminating another distance from said third gate conductor to form a third pair of junctions.

* * * * *